US007781830B2

(12) United States Patent
Wu et al.

(10) Patent No.: US 7,781,830 B2
(45) Date of Patent: Aug. 24, 2010

(54) RECESSED CHANNEL TRANSISTOR AND METHOD FOR PREPARING THE SAME

(75) Inventors: Hsiao Che Wu, Taoyuan County (TW); Ming Yen Li, Kaohsiung County (TW); Wen Li Tsai, Kaohsiung County (TW); Bin Siang Tsai, Changhua County (TW)

(73) Assignee: Promos Technologies Inc., Hsinchu (TW)

( * ) Notice: Subject to any disclaimer, the term of this patent is extended or adjusted under 35 U.S.C. 154(b) by 113 days.

(21) Appl. No.: 12/174,110

(22) Filed: Jul. 16, 2008

(65) Prior Publication Data
US 2010/0013004 A1 Jan. 21, 2010

(51) Int. Cl.
*H01L 29/78* (2006.01)
(52) U.S. Cl. .................. 257/331; 257/E21.41
(58) Field of Classification Search .......... 257/330, 257/331, 33, 336, E21.41
See application file for complete search history.

(56) References Cited

U.S. PATENT DOCUMENTS

| 6,303,448 | B1 | 10/2001 | Chang et al. | |
|---|---|---|---|---|
| 6,309,919 | B1 * | 10/2001 | Liu et al. | 438/199 |
| 6,352,902 | B1 * | 3/2002 | Aitken et al. | 438/386 |
| 6,358,800 | B1 * | 3/2002 | Tseng | 438/268 |
| 6,452,229 | B1 * | 9/2002 | Krivokapic | 257/330 |
| 6,534,352 | B1 * | 3/2003 | Kim | 438/197 |
| 6,621,107 | B2 * | 9/2003 | Blanchard et al. | 257/155 |
| 6,747,314 | B2 * | 6/2004 | Sundaresan et al. | 257/330 |
| 6,798,013 | B2 * | 9/2004 | Gonzalez | 257/315 |
| 6,815,297 | B1 * | 11/2004 | Krivokapic et al. | 438/287 |
| 6,852,597 | B2 * | 2/2005 | Park et al. | 438/268 |
| 6,902,980 | B2 | 6/2005 | Wang et al. | |
| 7,012,014 | B2 | 3/2006 | Lin et al. | |
| 7,015,543 | B2 * | 3/2006 | Kawamura et al. | 257/327 |
| 7,022,573 | B2 * | 4/2006 | Hsiao et al. | 438/259 |
| 7,033,892 | B2 * | 4/2006 | Hsu et al. | 438/270 |
| 2006/0017099 | A1 * | 1/2006 | Paik | 257/330 |
| 2007/0138545 | A1 * | 6/2007 | Lin et al. | 257/330 |
| 2007/0296031 | A1 * | 12/2007 | Tanaka | 257/330 |
| 2008/0054352 | A1 * | 3/2008 | Imoto et al. | 257/330 |

OTHER PUBLICATIONS

Wookje Kim, et al.; Drain leakage fluctuation reduction in the recessed channel array transistor DRAM with the elevated source-drain; Solid-State Device Research Conference; Sep. 2006; pp. 254-257; ESSDERC 2006. Proceeding of the 36th European.
Y.K. Park et al.; Fully Integrated 56 nm DRAM Technology for 1 Gb DRAM; 2007; pp. 190-191; Symposium on VLSI Technology Digest of Technical Papers.

* cited by examiner

*Primary Examiner*—Nathan W Ha
(74) *Attorney, Agent, or Firm*—WPAT, P.C.; Anthony King

(57) ABSTRACT

A recessed channel transistor comprises a semiconductor substrate having a trench isolation structure, a gate structure having a lower block in the semiconductor substrate and an upper block on the semiconductor substrate, two doped regions positioned at two sides of the upper block and above the lower block, and an insulation spacer positioned at a sidewall of the upper block and having a bottom end sandwiched between the upper block and the doped regions. In particular, the two doped regions serves as the source and drain regions, respectively, and the lower block of the gate structure serves as the recessed gate of the recessed channel transistor.

11 Claims, 10 Drawing Sheets

RECESSED CHANNEL TRANSISTOR AND METHOD FOR PREPARING THE SAME

BACKGROUND OF THE INVENTION (A) Field of the Invention

The present invention relates to a recessed channel transistor and method for preparing the same, and more particularly, to a recessed channel transistor with elevated doped regions serving as source and drain regions and a method for preparing the same.

(B) Description of the Related Art

FIG. 1 illustrates a planar channel metal-oxide-semiconductor field effect transistor (MOSFET) 10 according to the prior art. The planar channel transistor 10 is an important basic electronic device including a semiconductor substrate 12, a gate oxide layer 14, a conductive metal layer 16 serving as the gate and two doped regions 18 serving as the source/drain in the semiconductor substrate 12. The planar channel transistor 10 may further include a nitride spacer 22 positioned on the sidewall of the conductive metal layer 16 for isolating the conductive metal layer 16 from the other electronic device on the semiconductor substrate 12.

As semiconductor fabrication technology continues to improve, sizes of electronic devices are reduced, and the size and the channel length of the planar channel transistor 10 also decrease correspondingly. The planar channel transistor 10 in FIG. 1 has been widely used in the integrated circuit; however, the continuous decreasing of the size and the channel length of the planar channel transistor 10 results in a serious interaction between the two doped regions 18 and a carrier channel 24 under the gate oxide layer 14 such that the controlling ability of the conductive metal layer 16 on the switching operation of the carrier channel 24 is reduced, i.e., causes the so-called short channel effect, which impedes the functioning of the planar channel transistor 10. To address this problem, researchers developed the so-called recessed channel transistor with a recessed gate sandwiched between the two doped regions and an increased channel length.

FIG. 2 to FIG. 4 illustrate a method for preparing a recessed channel transistor 30 according to the prior art. First, a pad oxide layer 36 is formed to cover a semiconductor substrate 32 with a trench isolation structure 34, and an etching mask 38 having a plurality of openings 40 is then formed on the pad oxide layer 36. Subsequently, a dry etching process is performed to remove a portion of the semiconductor substrate 32 under the openings 40 of the etching mask 38 so as to form a plurality of recesses 42 in the semiconductor substrate 32, as shown in FIG. 3.

Referring to FIG. 4, after removing the etching mask 38, recessed gates 44 filling the recesses 42 and word lines 46 connecting the recessed gates 44 are formed. Subsequently, an implanting process is performed to implant dopants into the semiconductor substrate 32 and form two doped regions 48 serving as the source and the drain at two sides of the recessed gates 44 in the semiconductor substrate 32.

The recessed channel transistor 30 has shown good data retention time characteristics as compared to the planar channel transistor 10 because of its superiorities in drain-induced barrier lowering (DIBL), sub-threshold slope, and junction leakage. However, the recessed channel transistor 30 exhibits a significant gate induced drain leakage (GIDL) current due to the large overlap between the recessed gate 44 and the source/drain regions 48 as compared to the planar channel transistor 10, which exhibits substantially no overlap between the gate 16 and the source/drain regions 18, as shown in FIG. 1.

SUMMARY OF THE INVENTION

One aspect of the present invention provides a recessed channel transistor with elevated doped regions serving as source and drain and a method for preparing the same, which can reduce drain leakage current and also reduce the fluctuation of leakage current to enhance the data retention time.

A recessed channel transistor according to this aspect of the present invention comprises a semiconductor substrate having a trench isolation structure, a gate structure having a lower block in the semiconductor substrate and an upper block on the semiconductor substrate, two doped regions positioned at two sides of the upper block and above the lower block, and an insulation spacer positioned at a sidewall of the upper block and having a bottom end sandwiched between the upper block and the doped regions. In particular, the two doped regions serves as the source and drain regions, respectively, and the lower block of the gate structure serves as the recessed gate of the recessed channel transistor.

Another aspect of the present invention provides a method for preparing a recessed channel transistor comprising the steps of forming a recess in a semiconductor substrate having a trench isolation structure, enlarging an upper portion of the recess to form an enlarged area, forming a gate structure having a lower block in the recess and an upper block on the lower block, forming an insulation spacer at a sidewall of the upper block and having a bottom end in the enlarged area, and forming two doped regions at two sides of the enlarged area.

The conventional recessed channel transistor exhibits a significant gate induced drain leakage current due to the large overlap between the recessed gate and the source/drain regions. In contrast, the source/drain regions of the recessed channel transistor are positioned above the recessed gate; therefore, the gate induced drain leakage current due to the overlap between the recessed gate and the source/drain regions can be dramatically decreased according to the present invention.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
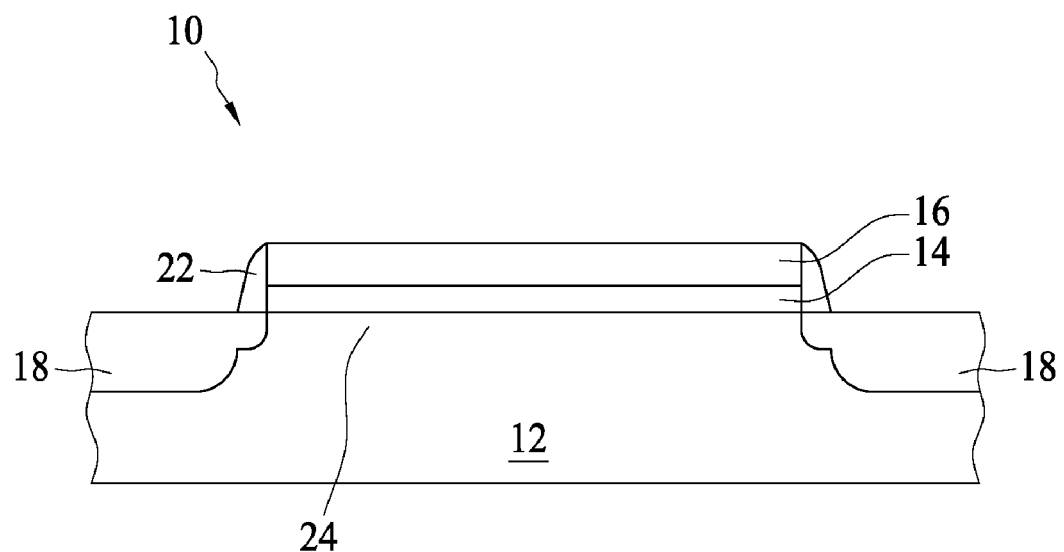
FIG. 1 illustrates a planar channel metal-oxide-semiconductor field effect transistor (MOSFET) according to the prior art.
Figure 2:
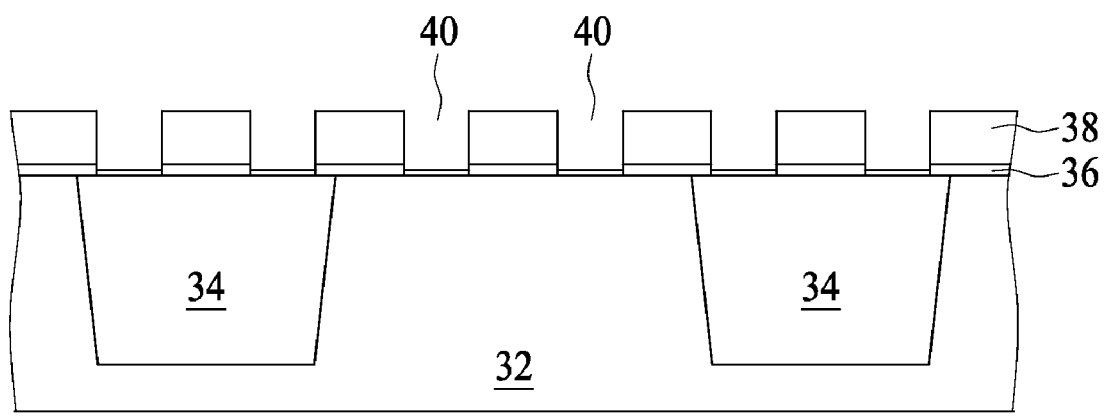
FIG. 2 to FIG. 4 illustrate a method for preparing a recessed channel transistor according to the prior art.
Figure 3:
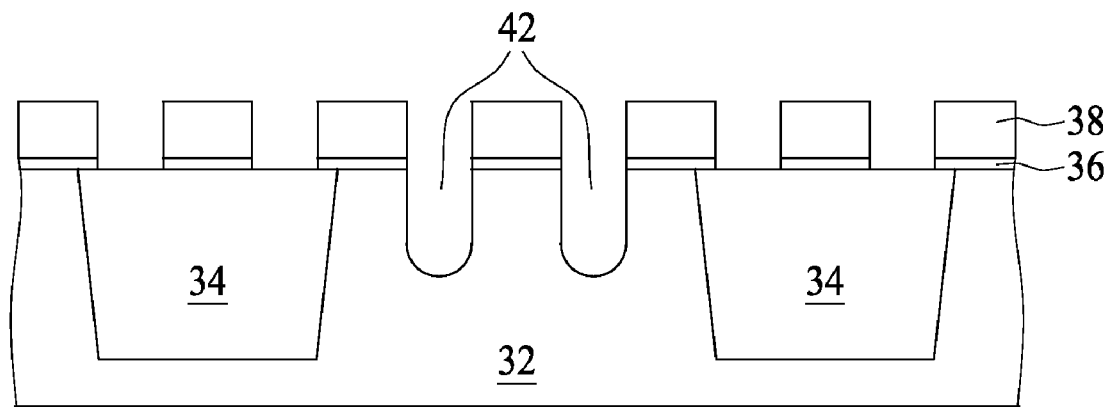
Figure 4:
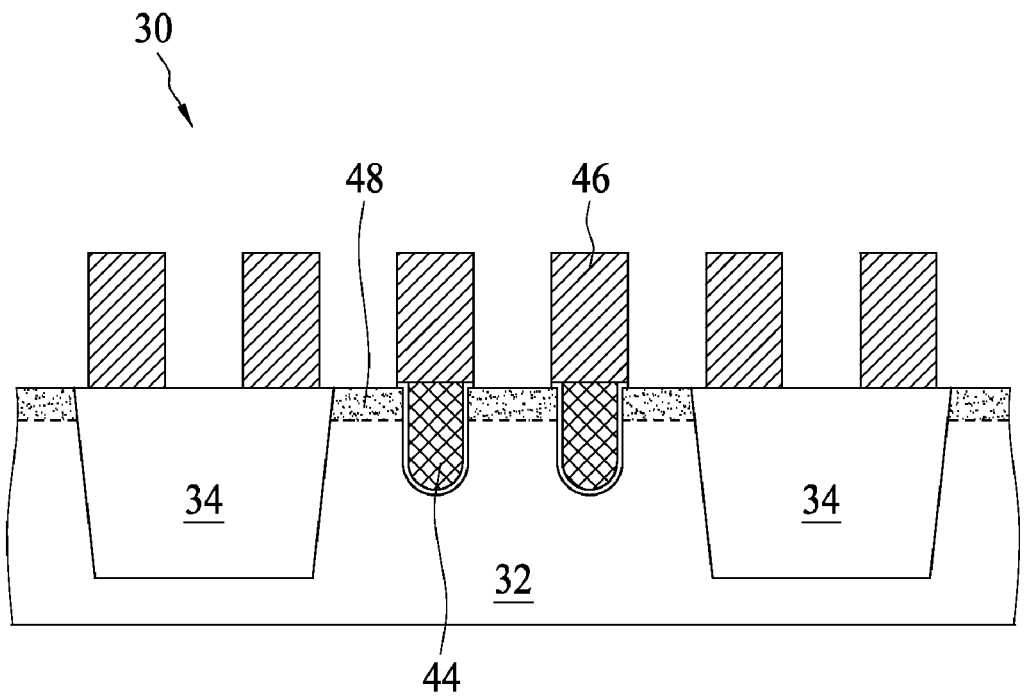
Figure 5:
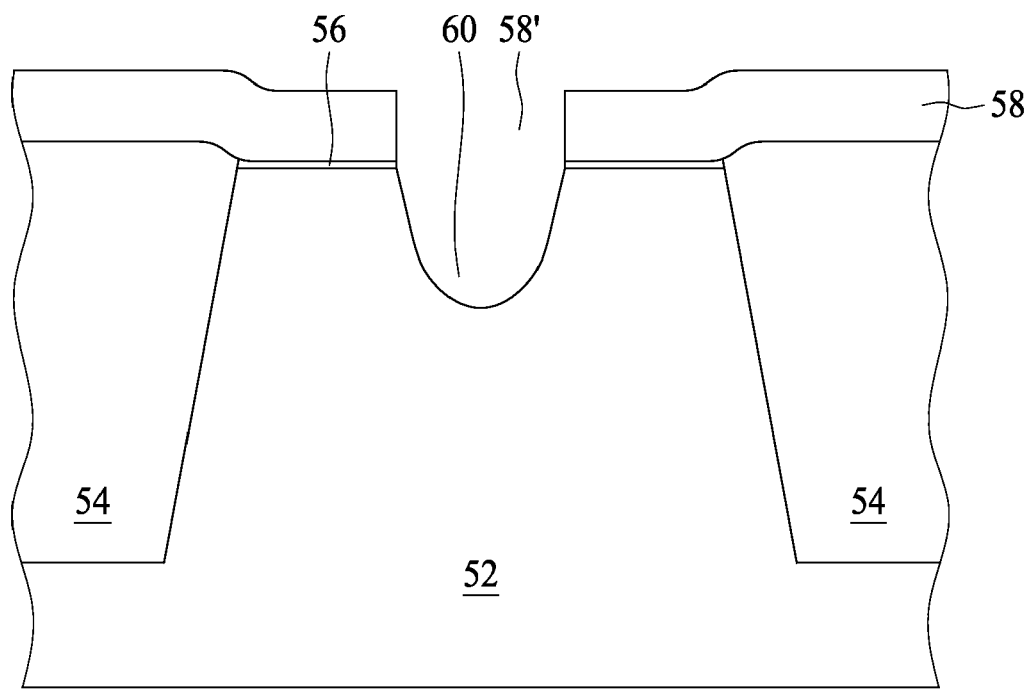
FIG. 5 to FIG. 15 illustrate a method for preparing a recessed channel transistor according to one embodiment of the present invention.

FIG. 5 to FIG. 15 illustrate a method for preparing a recessed channel transistor 50 according to one embodiment of the present invention. First, a pad oxide layer 56 is formed by the thermal oxidation process on the surface of a semiconductor substrate 52 such as a silicon substrate with a shallow trench isolation (STI) structure 54, and a pad nitride layer 58 is formed on the pad oxide layer 54 by the deposition process followed by a lithographic process and dry etching process to form an opening 58' in the pad nitride layer 58. Subsequently, a dry etching process is performed by using the pad nitride layer 58 as an etching mask to remove a portion of the semiconductor substrate 52 under the opening 58' of the pad nitride layer 58 to form a recess 60 in the semiconductor substrate 52.

Figure 6:
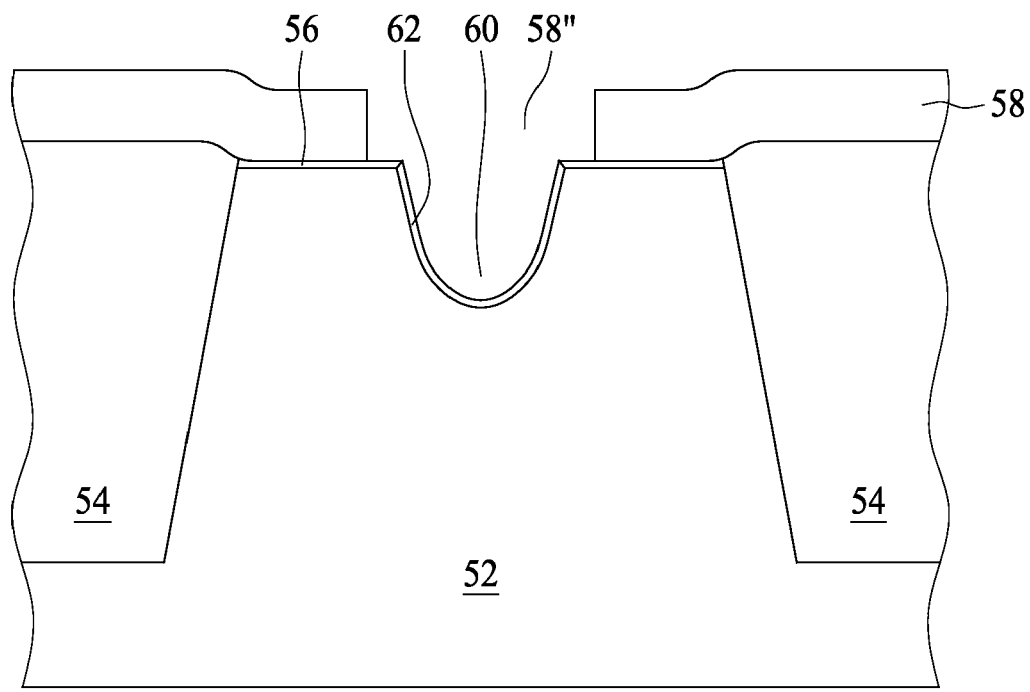
Figure 7:
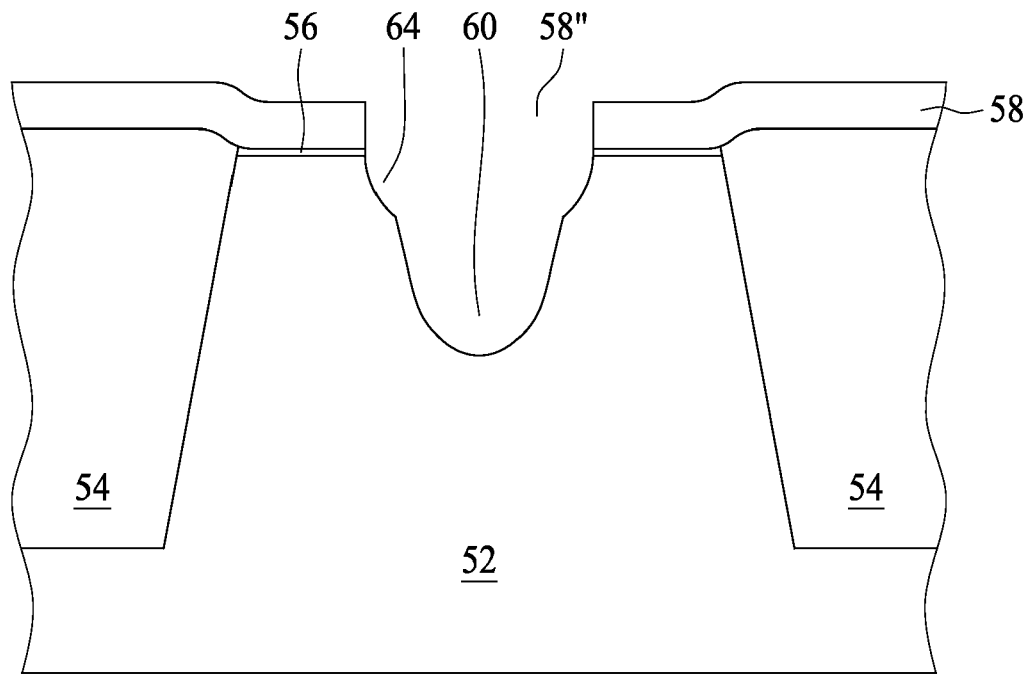

Referring to FIG. 6, a thermal oxidation process is performed to form an oxide layer 62 on the inner sidewall of the recess 60, and an etching process is then performed to remove a corner portion of the pad nitride layer 58 adjacent to the recess 60 to pull back the pad nitride layer 58 such that the opening 58' is enlarged to become an opening 58" in the pad nitride layer 58. Subsequently, a dry etching process is performed by using the pad nitride layer 58 as an etching mask to remove an upper portion of the semiconductor substrate 52 under the opening 58", i.e., enlarge an upper portion of the recess 60 to form an enlarged area 64, as shown in FIG. 7.

Figure 8:
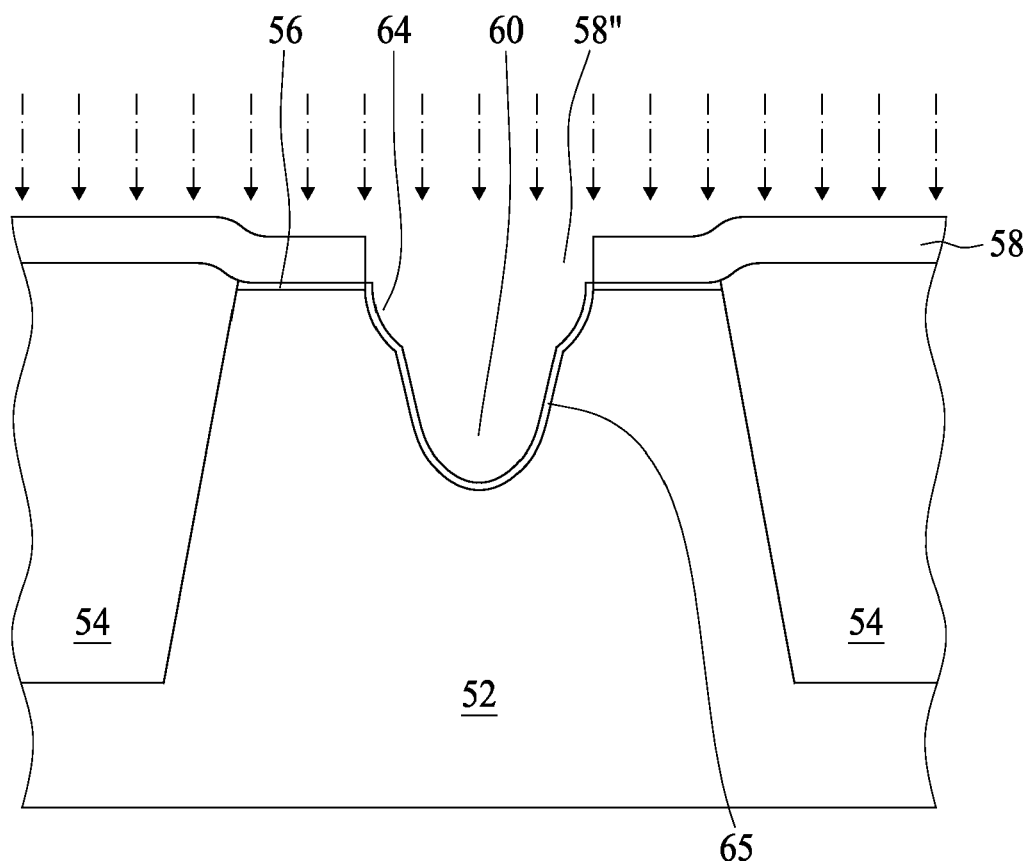
Figure 9:
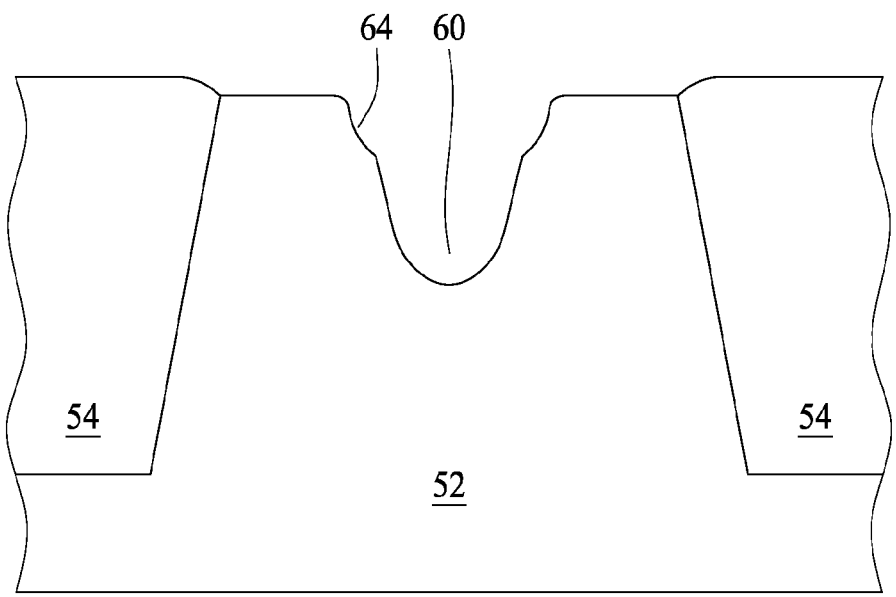

Referring to FIG. 8, a thermal oxidation process is performed to form a screen oxide layer 65 on the exposed surface of the semiconductor substrate 52 in the recess 60 and the enlarged area 64, and an implanting process is then performed to implant dopants into the semiconductor substrate 52 through the recess 60 for adjusting the carrier density of the carrier channel in the semiconductor substrate 52 below the recess 60. Subsequently, a stripping process is performed to remove the pad oxide layer 56, the pad nitride layer 58 and the screen oxide layer 65 from the surface of the semiconductor substrate 52, as shown in FIG. 9.

Figure 10:
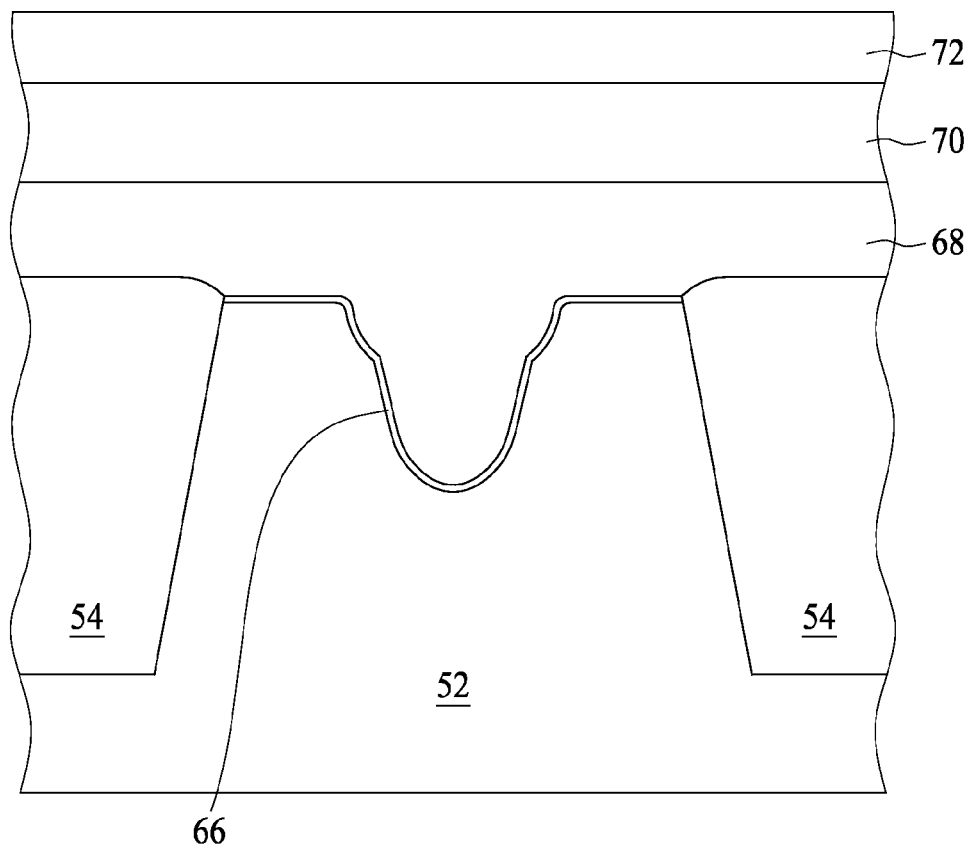

Referring to FIG. 10, a thermal oxidation process is performed to form a dielectric layer 66 on the exposed surface of the semiconductor substrate 52, and a conductive polysilicon layer 68, a tungsten silicide layer 70 and a cap nitride layer 72 are then formed on the dielectric layer 66 in sequence by the deposition processes. In particular, the dielectric layer 66 covers the surface of the recess 60 and the surface of the enlarged area 64. Subsequently, a lithographic process is performed to form a mask 74 such as a patterned photoresist layer covering a portion of the conductive polysilicon layer 68 directly above the recess 60, and a dry etching process is then performed to remove a portion of the cap nitride layer 72, the tungsten silicide layer 70 and the conductive polysilicon layer 68 not covered by the mask 74 so as to form a gate structure 69 having a lower block 68A in the recess 60 and an upper block 68B on the lower block 68A, as shown in FIG. 11.

Figure 11:
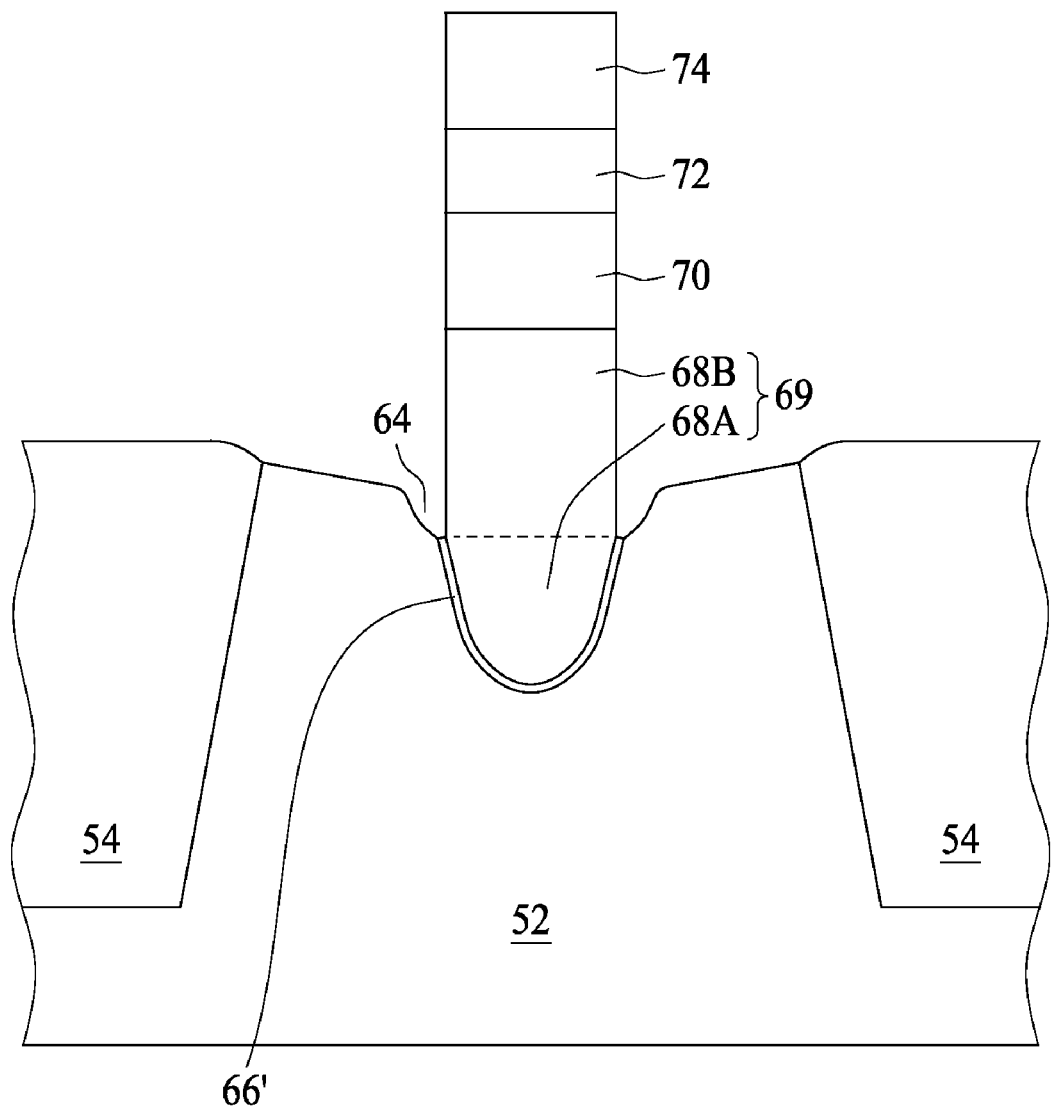

The dry etching process also removes a portion of the dielectric layer 66 from the exposed surfaces of the enlarged area 64 and the semiconductor substrate 52 not covered by the mask 74, while the other portion of the dielectric layer 66 covered by the lower block 68A, i.e., under the mask 74, is not removed to leave a gate oxide layer 66' sandwiched between the semiconductor substrate 52 and the lower block 68A of the gate structure 69, as shown in FIG. 11. In particular, the lower block 68A serves as a recessed gate and the upper block 68B serves as a portion of the word line.

Figure 12:
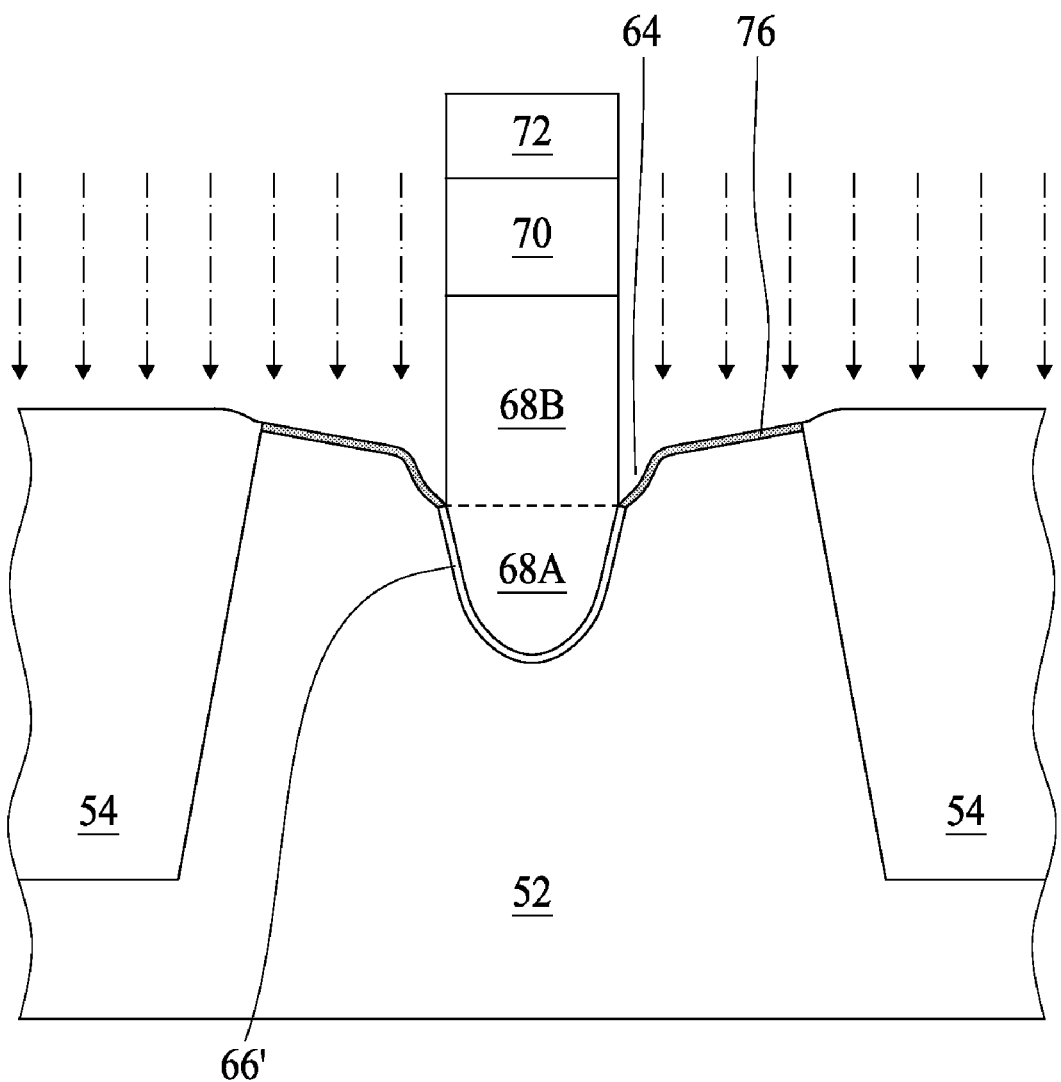
Figure 13:
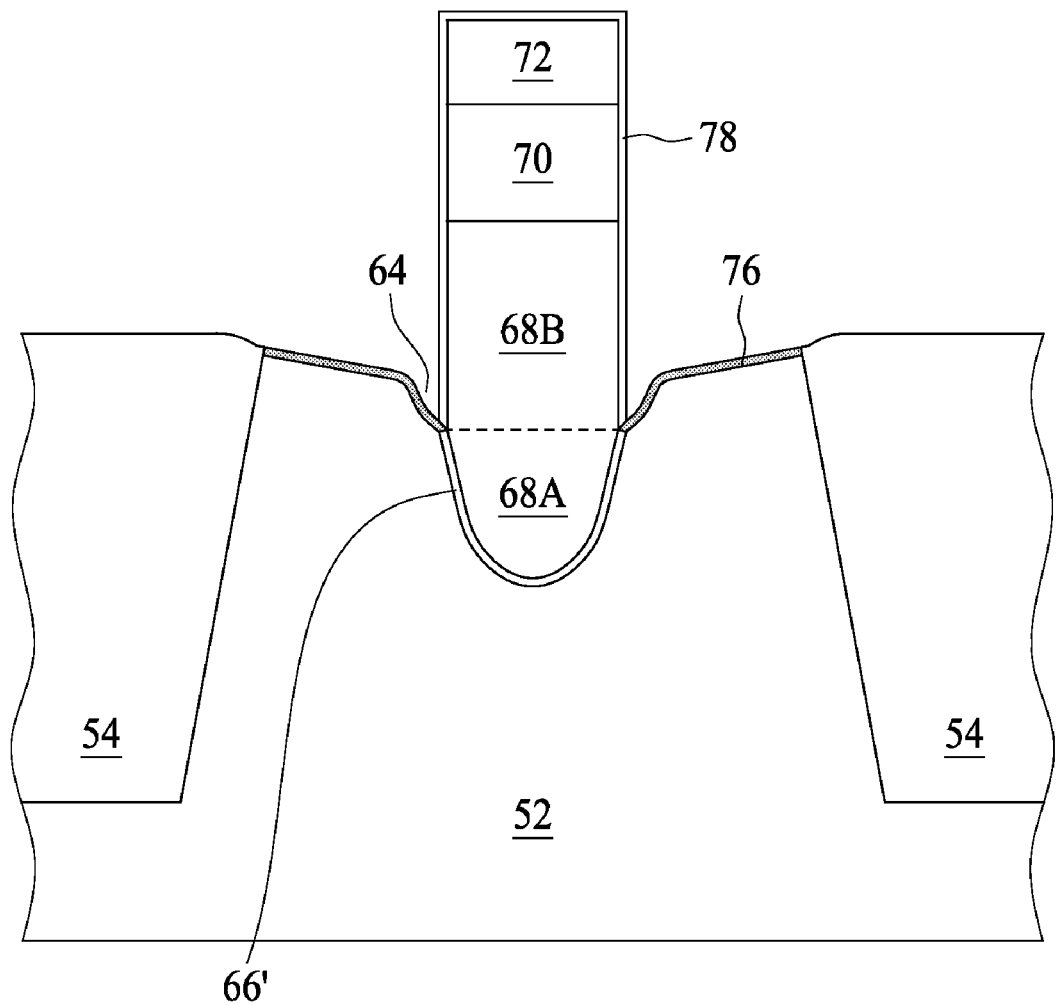

Referring to FIG. 12, the mask 74 is stripped, a thermal oxidation process is performed to form a screen oxide layer 76 on the exposed surface of the semiconductor substrate 52, and an implanting process (LDD implant) is performed to implant lightly dopants into the enlarged area 64. Subsequently, a liner oxide layer 78 is formed on the sidewalls of the cap nitride layer 72, the tungsten silicide layer 70, and the upper block 68B of the gate structure 69, as shown in FIG. 13.

Figure 14:
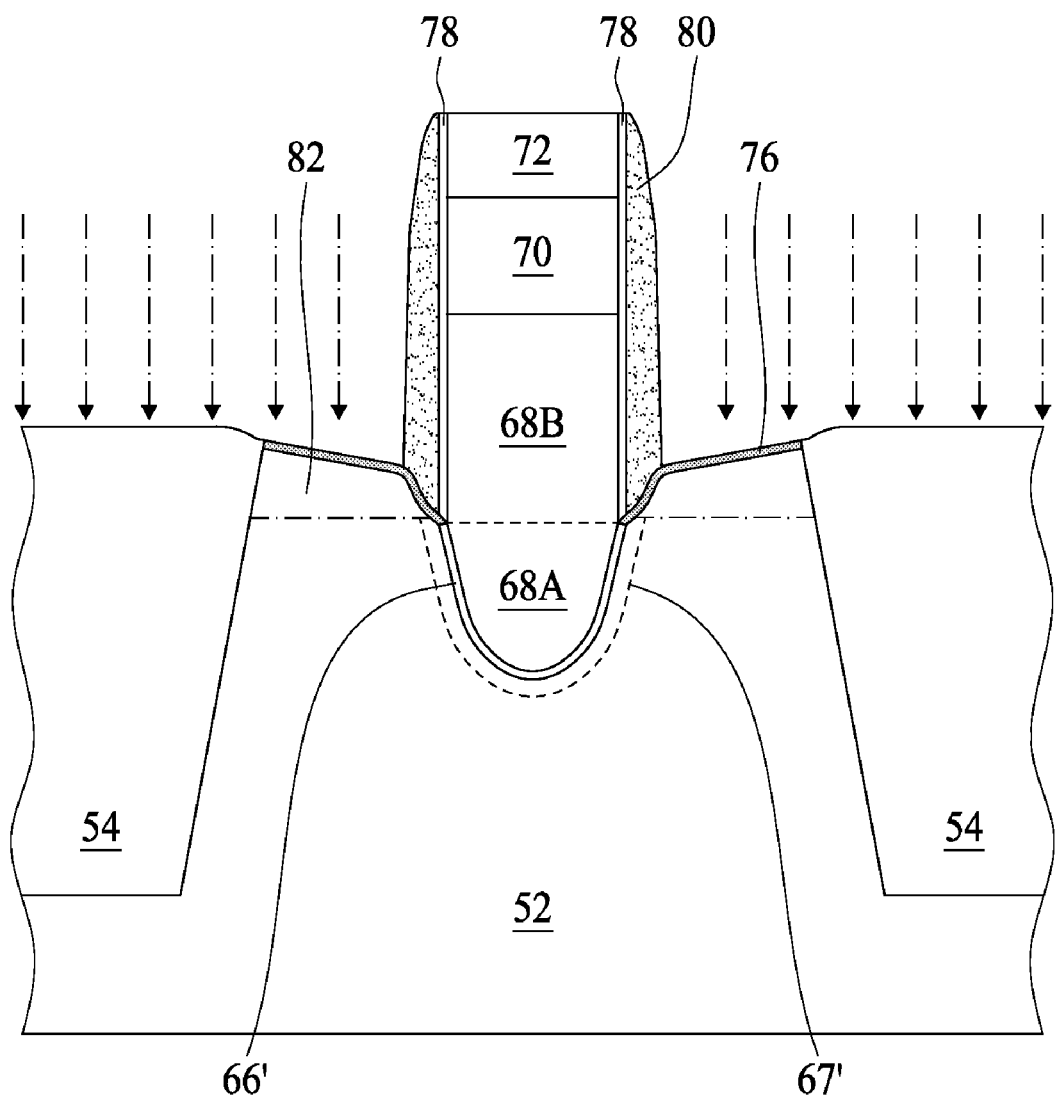

Referring to FIG. 14, an insulation spacer 80 is formed at the sidewall of the upper block 68B with a bottom end in the enlarged area 64 by depositing an insulation layer on the surface of the semiconductor substrate 52 and on the sidewall of the upper block 68B, which is followed by a dry etching process. Subsequently, an implanting process is performed to implant dopants into a portion of the semiconductor substrate 52 at two sides of the enlarged area 64 to form two doped regions 82 covering a surface of the semiconductor substrate 52 positioned at two sides of the upper block 68B and above the lower block 68A, serving as source and drain regions respectively.

In particular, the two doped regions 82 are positioned at two sides of the upper block 68B and below an upper surface of the shallow trench isolation structure 54. The two doped regions 82 serving as the source/drain regions are positioned above the lower block 68A, and the carrier channel 67' is positioned in the semiconductor substrate 52 below the lower block 68A filling the recess 60. In other words, the source/drain regions are above the carrier channel 67', i.e., the source/drain regions 82 are elevated source/drain regions.

Furthermore, the insulation spacer 80 is positioned at the sidewall of the upper block 68B and has a bottom end sandwiched between the upper block 68B and the doped regions 82. The bottom end of the insulation spacer 80 is tapered in the enlarged area 64, and positioned below the upper surface of the shallow trench isolation structure 54. The liner oxide layer 78 is sandwiched between the upper block 68B and the insulation spacer 80.

Figure 15:
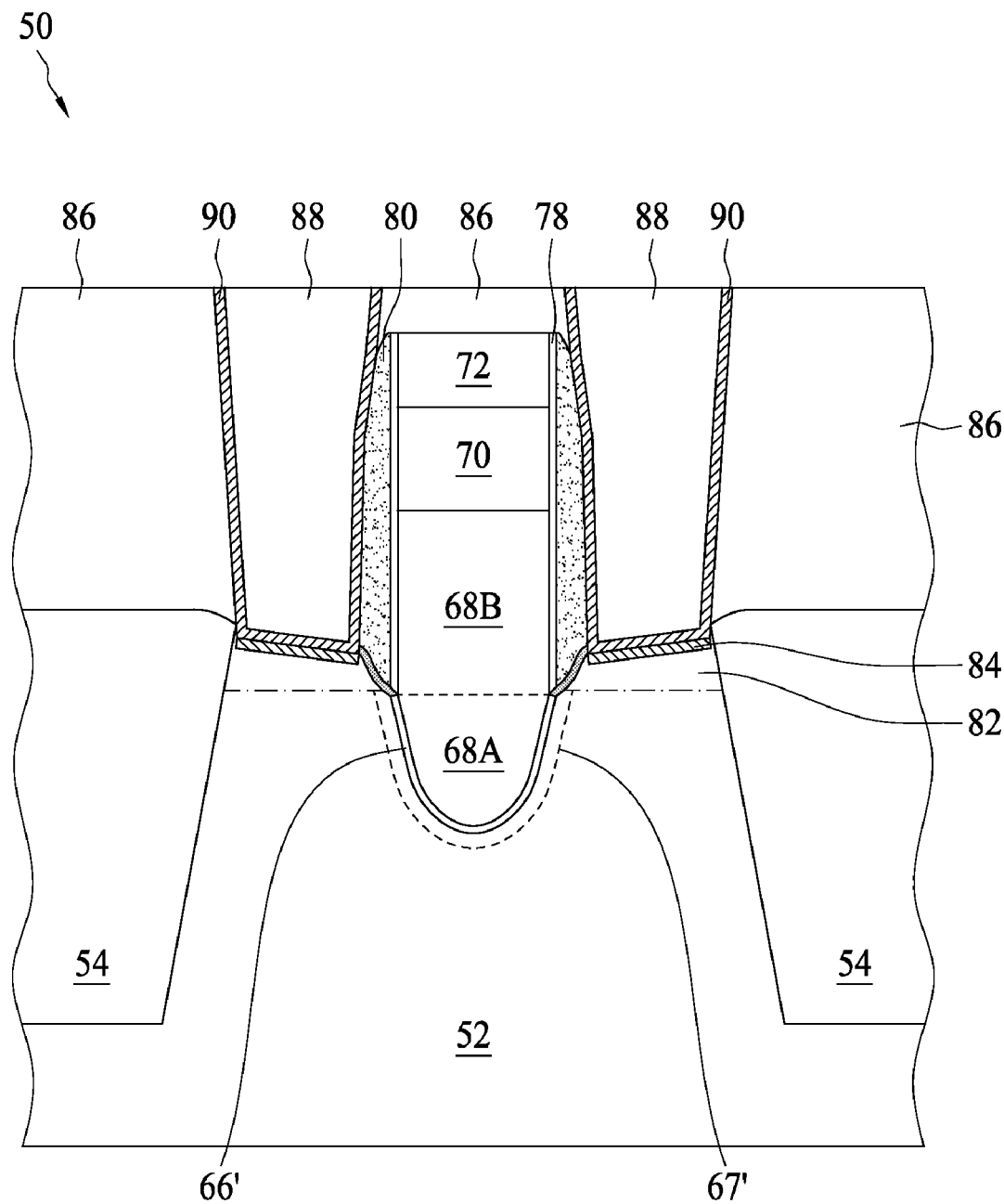

Referring to FIG. 15, a siliciding process is performed to convert two upper portions of the two doped regions 82 into two metal silicides 84 with better conductivity, and an insulation layer 86 is formed on the semiconductor substrate 52 by the deposition process. Subsequently, conductive metal plugs 88 such as tungsten plug are formed in the insulation layer 86 and electrically connect metal silicide 84 in the doped regions 82 via a conductive buffer layer 90 such as titanium nitride to complete the recessed channel transistor 50. In particular, the insulation spacer 80 is separated from the conductive metal plug 88 by the conductive buffer layer 90.

The conventional recessed channel transistor 30 exhibits a significant gate induced drain leakage current due to the large overlap between the recessed gate 44 and the source/drain regions 48. In contrast, the source/drain regions 82 of the recessed channel transistor 50 are positioned above the lower block 68A serving as the recessed gate; therefore, the gate induced drain leakage current due to the overlap between the recessed gate 68A and the source/drain regions 82 can be dramatically decreased according to the present invention.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A recessed channel transistor, comprising:
    a semiconductor substrate having a trench isolation structure;
    a gate structure having a lower block in the semiconductor substrate and an upper block on the semiconductor substrate;
    two doped regions positioned at two sides of the upper block and above the lower block; and
    an insulation spacer positioned at a sidewall of the upper block and having a bottom end sandwiched between the upper block and the doped regions.

2. The recessed channel transistor of claim 1, wherein the two doped regions are positioned below an upper surface of the trench isolation structure.

3. The recessed channel transistor of claim 1, wherein the lower block serves as a recessed gate and the upper block serves as a word line.

4. The recessed channel transistor of claim 1, wherein the bottom end of the insulation spacer is tapered.

5. The recessed channel transistor of claim 1, wherein the bottom end of the insulation spacer is positioned below an upper surface of the trench isolation structure.

6. The recessed channel transistor of claim 1, further comprising a liner oxide layer sandwiched between the upper block and the insulation spacer.

7. The recessed channel transistor of claim 1, wherein the doped regions include a metal silicide.

8. The recessed channel transistor of claim 7, further comprising a conductive buffer layer positioned on the metal silicide.

9. The recessed channel transistor of claim 8, further comprising a conductive plug positioned on the conductive buffer layer.

10. The recessed channel transistor of claim 9, wherein the insulation spacer is separated from the conductive plug by the conductive buffer layer.

11. The recessed channel transistor of claim 1, when turned on, a carrier channel directly conducting the two doped regions is positioned alongside the lower block.

* * * * *